United States Patent
Hasegawa et al.

(10) Patent No.: US 8,653,802 B2
(45) Date of Patent: Feb. 18, 2014

(54) CHOPPER CIRCUIT, DC/DC CONVERTER, AND FUEL CELL SYSTEM

(75) Inventors: Takahiko Hasegawa, Toyota (JP); Kota Manabe, Toyota (JP); Toshihiko Minamii, Nisshin (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/582,853

(22) PCT Filed: Feb. 16, 2011

(86) PCT No.: PCT/IB2011/000292
§ 371 (c)(1),
(2), (4) Date: Sep. 5, 2012

(87) PCT Pub. No.: WO2011/107844
PCT Pub. Date: Sep. 9, 2011

(65) Prior Publication Data
US 2012/0326687 A1 Dec. 27, 2012

(30) Foreign Application Priority Data
Mar. 5, 2010 (JP) ................. 2010-048504

(51) Int. Cl.
*G05F 1/00* (2006.01)
(52) U.S. Cl.
USPC .......................................... 323/283
(58) Field of Classification Search
USPC ......... 323/234, 237, 241, 265, 271, 273, 274, 323/275, 282, 283, 284, 285
See application file for complete search history.

(56) References Cited

U.S. PATENT DOCUMENTS

| | | | |
|---|---|---|---|
| 5,737,199 A | 4/1998 | Kanamori et al. | |
| 2004/0085087 A1 | 5/2004 | Zehentner et al. | |
| 2006/0139979 A1* | 6/2006 | Song | 363/124 |
| 2007/0085514 A1* | 4/2007 | Utsunomiya | 323/222 |
| 2008/0036432 A1* | 2/2008 | Takada et al. | 323/234 |
| 2008/0067989 A1* | 3/2008 | Kasai et al. | 323/271 |
| 2009/0219006 A1 | 9/2009 | Gekinozu | |

FOREIGN PATENT DOCUMENTS

| | | |
|---|---|---|
| CH | 682 611 A5 | 10/1993 |
| DE | 10236377 A1 | 2/2012 |
| EP | 1 990 901 A2 | 11/2008 |
| JP | 2001-309646 A | 11/2001 |
| JP | 2009-112182 A | 5/2009 |
| JP | 2009-165245 A | 7/2009 |
| WO | 01/03277 A2 | 1/2001 |
| WO | 2006/98376 A1 | 9/2006 |

OTHER PUBLICATIONS

International Search Report of PCT/IB2011/000292 mailed Oct. 24, 2011.

* cited by examiner

*Primary Examiner* — Adolf Berhane
*Assistant Examiner* — Jeffrey Gblende
(74) *Attorney, Agent, or Firm* — Kenyon & Kenyon LLP

(57) ABSTRACT

A chopper circuit includes an input unit that inputs a main turn-on signal for turning on a main switching element and an auxiliary turn-on signal for turning on an auxiliary switching element; and a prohibiting unit that prohibits the main switching element from turning on unless the auxiliary turn-on signal is input.

6 Claims, 7 Drawing Sheets

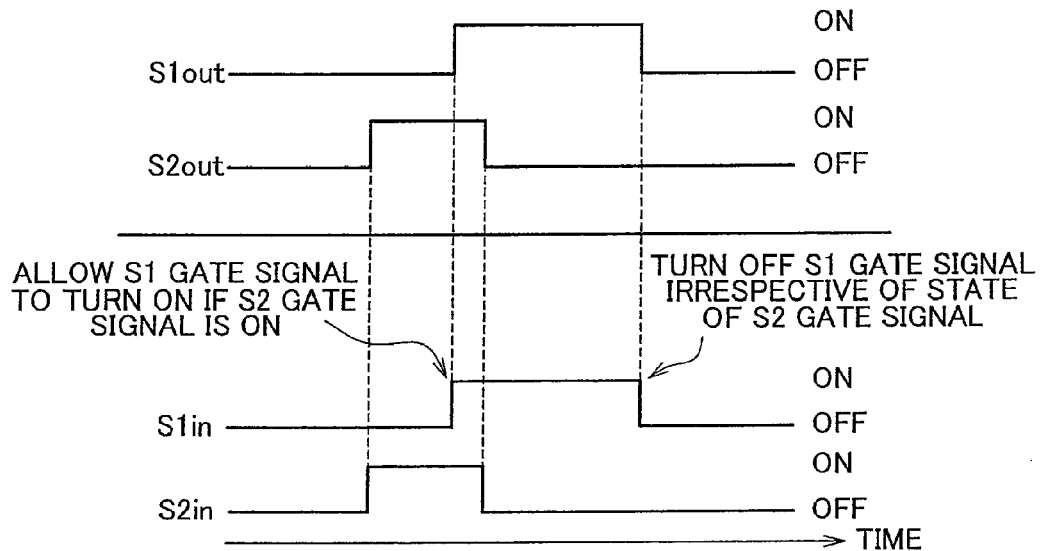
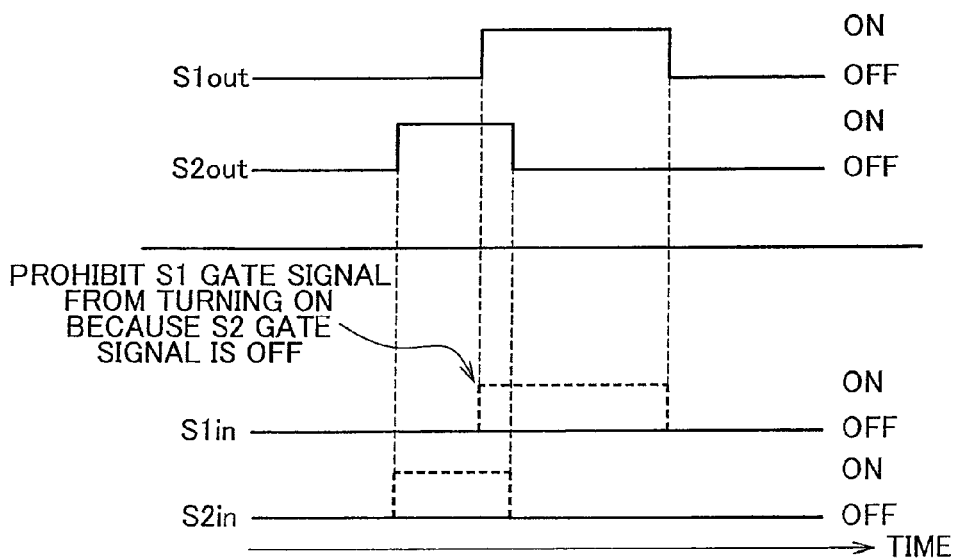

IN EVENT OF ABNORMALITY OF S2 GATE SIGNAL

AFTER CORRECTION
USING DELAY CIRCUIT

CHOPPER CIRCUIT, DC/DC CONVERTER, AND FUEL CELL SYSTEM

This is a 371 national phase application of PCT/IB2011/000292 filed 16 Feb. 2011, claiming priority to Japanese Patent Application No. 2010-048504 filed 5 Mar. 2010, the contents of which are incorporated herein by reference.

BACKGROUND OF THE INVENTION

1. Field of the Invention

The invention relates to a chopper circuit that uses soft switching operation and a technique associated with the chopper circuit.

2. Description of the Related Art

In an existing art, in the field using a semiconductor power converter, a soft switching chopper circuit is used in order to reduce power loss (Japanese Patent Application Publication No. 2009-112182 (JP-A-2009-112182)).

Turn-on/off operations of a main switching element and auxiliary switching element of the chopper circuit are carried out in such a manner that gate signals that are turn-on/off signals are respectively transmitted from a control unit to both switching elements. The gate signals from the control unit are transmitted via a wire harness (WH), or the like, for signal transmission. However, there is a case where the gate signal is not input to the auxiliary switching element because of a break in the wire harness, an external noise, or the like, and then the auxiliary switching element does not operate. In this case, as the main switching element operates, there is a possibility that a voltage applied to the main switching element increases to cause the switching operation of the main switching element to become hard switching, resulting in a breakdown.

SUMMARY OF INVENTION

The invention provides a chopper circuit and a technique associated with the chopper circuit.

A first aspect of the invention provides a chopper circuit. The chopper circuit includes an input unit that inputs a main turn-on signal for turning on a main switching element and an auxiliary turn-on signal for turning on an auxiliary switching element; and a prohibiting unit that prohibits the main switching element from turning on unless the auxiliary turn-on signal is input.

In the chopper circuit that uses soft switching operation, the timing of switching of the auxiliary switching element is controlled to decrease a voltage applied to the main switching element when the main switching element is turned on. In the case where switching operation is carried out in the above aspect, if abnormality, or the like (cable breakage, noise, or the like) occurs in a transmission line that transmits the auxiliary turn-on signal to the auxiliary switching element and, therefore, the auxiliary turn-on signal is not normally input to the auxiliary switching element, the auxiliary switching element cannot carry out control for decreasing a voltage applied to the main switching element, so the main switching element is subjected to switching at a high voltage (hard switching operation). When the main switching element is subjected to hard switching operation, a breakdown may occur. In the chopper circuit according to the above aspect, the prohibiting unit prohibits the main switching element from turning on when the auxiliary turn-on signal is not normally input to the auxiliary switching element because of abnormality, or the like, of the transmission line. Thus, the main switching element is not subjected to hard switching operation, so it is possible to avoid a breakdown of the main switching element.

In the above aspect, the prohibiting unit may include a delay circuit, and the delay circuit may prohibit the main switching element from turning on unless a predetermined period of time has elapsed after the auxiliary turn-on signal is input to the auxiliary switching element.

When noise, or the like, is included in the signal of transmission line of the switching signals and, therefore, the auxiliary turn-on signal and the main turn-on signal are input to the chopper circuit at a short time interval, in an ordinary chopper circuit, the timing of switching of each of the auxiliary switching element and main switching element may fall outside a normal range and, therefore, the main switching element may be subjected to hard switching operation. However, with the chopper circuit according to the above aspect, because the chopper circuit includes the delay circuit, even when the auxiliary turn-on signal and the main turn-on signal are input at a short time interval between the auxiliary turn-on signal and the main turn-on signal, the time interval is corrected to a normal time interval. Thus, it is possible to avoid hard switching operation of the main switching element.

In the above aspect, the prohibiting unit may be formed of a logic circuit. With the chopper circuit according to the above aspect, because the prohibiting unit is formed of a logic circuit, it is possible to control switching of the main switching element with faster determination than when it is determined whether to turn on the main switching element through processing executed by a CPU.

A second aspect of the invention provides a DC/DC converter. The DC/DC converter includes a DC input unit that is connected to a direct-current power supply; a chopper circuit that converts a voltage of direct-current power input from the DC input unit; and a DC output unit that outputs a direct-current voltage converted in voltage by the chopper circuit, wherein the chopper circuit includes a main switching element; an auxiliary switching element; an input unit that inputs a main turn-on signal for turning on the main switching element and an auxiliary turn-on signal for turning on the auxiliary switching element; and a prohibiting unit that prohibits the main switching element from turning on unless the auxiliary turn-on signal is input, wherein the chopper circuit controls a timing of switching of the auxiliary switching element to carry out soft switching operation for controlling a voltage applied to the main switching element when the main switching element is turned on. According to the above aspect, when the auxiliary turn-on signal of the chopper circuit is not input to the auxiliary switching element, it is possible to avoid hard switching operation of the main switching element.

A third aspect of the invention provides a fuel cell system. The fuel cell system includes a fuel cell that supplies electric power to a load; and a DC/DC converter that uses a chopper circuit to control a voltage of the electric power, wherein the chopper circuit includes a main switching element; an auxiliary switching element; an input unit that inputs a main turn-on signal for turning on the main switching element and an auxiliary turn-on signal for turning on the auxiliary switching element; and a prohibiting unit that prohibits the main switching element from turning on unless the auxiliary turn-on signal is input, wherein the chopper circuit controls a timing of switching of the auxiliary switching element to carry out soft switching operation for controlling a voltage applied to the main switching element when the main switching element is turned on. According to the above aspect, when the auxiliary turn-on signal of the chopper circuit is not input to the auxiliary switching element, it is possible to avoid hard switching operation of the main switching element.

Note that the aspects of the invention may be implemented in various forms. For example, the aspects of the invention may be implemented in a form, such as a soft switching method, a soft switching device, an electric power conversion system, an integrated circuit and computer program for implementing the functions of the method or device and a recording medium that records the computer program therein.

BRIEF DESCRIPTION OF DRAWINGS

The features, advantages, and technical and industrial significance of this invention will be described below with reference to the accompanying drawings, in which like numerals denote like elements, and wherein:

FIG. 4A and FIG. 4B are timing charts that illustrate the effect of the logic circuit according to an embodiment;

DETAILED DESCRIPTION OF EMBODIMENTS

Next, an embodiment of the invention will be described.

A. First Embodiment (A1) Configuration of Fuel Cell System

A fuel cell hybrid vehicle (FCHV) is assumed as an example of a vehicle in the present embodiment; however, the present embodiment may also be applied to an electric vehicle or a hybrid vehicle.

Figure 1:
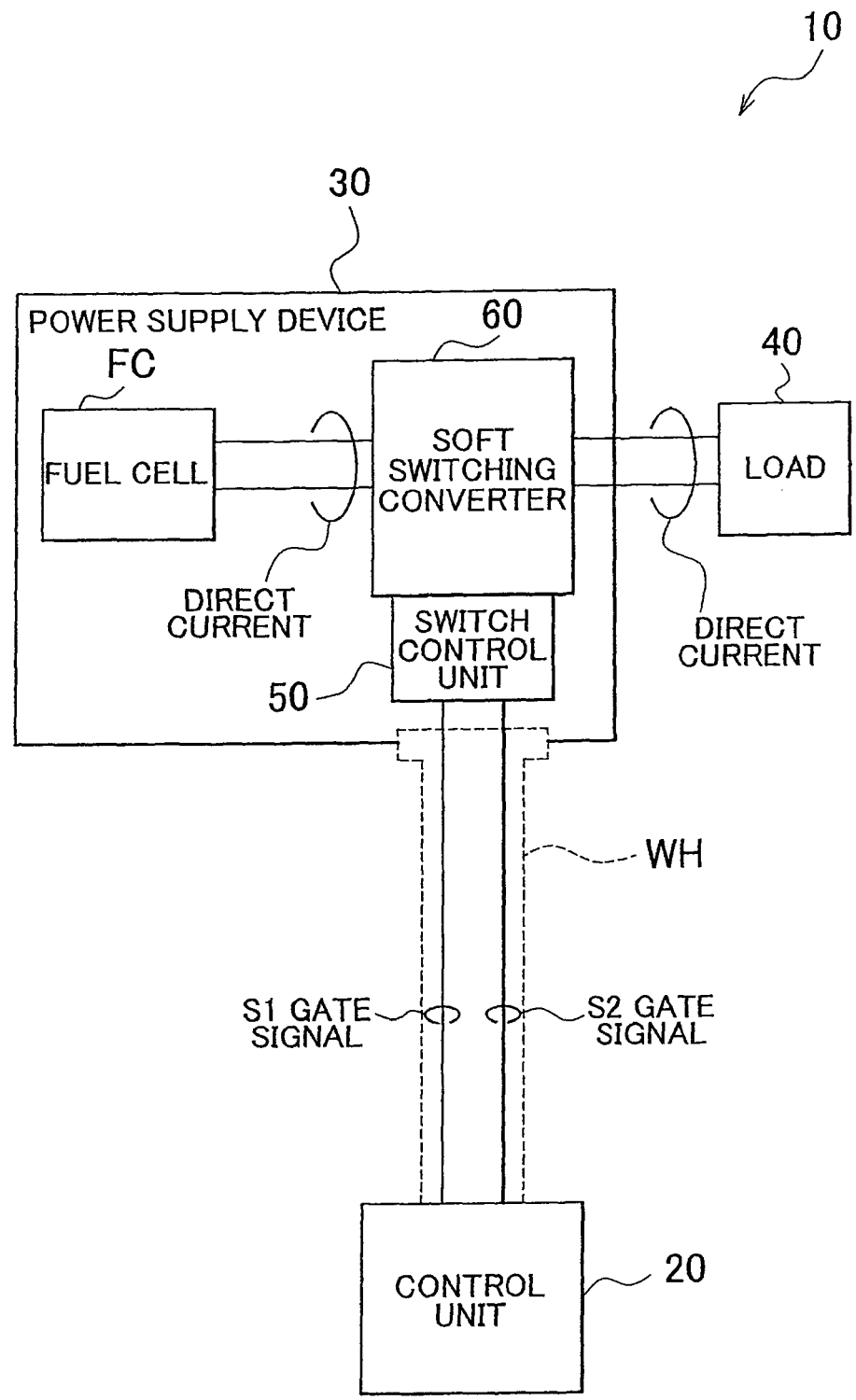
FIG. 1 is a view that illustrates the configuration of a fuel cell system 10.

FIG. 1 is a view that illustrates the configuration of a fuel cell system 10 equipped for the vehicle according to the first embodiment. The fuel cell system 10 includes a control unit 20, a power supply device 30 and a load 40. The power supply device 30 supplies direct-current power to the load 40. The load 40, for example, includes a load that operates on direct current or a load that operates on alternating current via an inverter. The power supply device 30 is connected to the control unit 20 by a wire harness WH. For example, while the vehicle is running, the control unit 20 computes an electric power required by the load 40 on the basis of the acceleration of the vehicle, a load on a peripheral device (illumination lamp, audio, or the like), and the like, and then controls an electric power output from the power supply device 30 in response to the computed result. Furthermore, the power supply device 30 includes a switch control unit 50, a soft switching converter 60, and a fuel cell FC. The switch control unit 50 is connected between the control unit 20 and the soft switching converter 60 in the power supply device 30. The switch control unit 50 will be described in detail later.

The fuel cell FC employs a power generation mode that produces electric power from supplied fuel gas (for example, hydrogen gas) and oxidation gas. The fuel cell FC has a stack structure in which a plurality of single cells each having a membrane electrode assembly (MEA), and the like, are stacked in series with one another. Specifically, various types of fuel cells, such as a polymer electrolyte fuel cell, a phosphoric acid fuel cell and a molten carbonate fuel cell, may be used.

The soft switching converter 60 is a DC/DC converter (step-up converter) that steps up the voltage of direct-current power supplied from the fuel cell FC. The soft switching converter 60 includes a switching element S1, which will be described later, and is formed of a chopper circuit that controls the voltage of electric power supplied to the load 40 by means of switching operation of the switching element S1. The soft switching converter 60 includes a switching element S2, which will be described later, and controls the timing of switching of the switching element S2 to decrease a voltage applied to the switching element S1 at the time of switching operation of the switching element S1. Soft switching operation of the switching element S1 is implemented by the above switching operation of the switching element S2.

The control unit 20 is configured as a microcomputer that includes a CPU, a RAM and a ROM inside. The control unit 20 outputs the gate signals toward the soft switching converter 60 in accordance with the above described processing based on the acceleration, or the like. The gate signals respectively control the timings of switching of the switching element S1 and switching element S2 of the soft switching converter 60. Specifically, the control unit 20 outputs the S1 gate signal and the S2 gate signal toward the soft switching converter 60 via the wire harness WH. The S1 gate signal is used to control the timing of switching of the switching element S1. The S2 gate signal is used to control the timing of switching of the switching element S2.

(A2) Configuration of Soft Switching Converter

Figure 2:
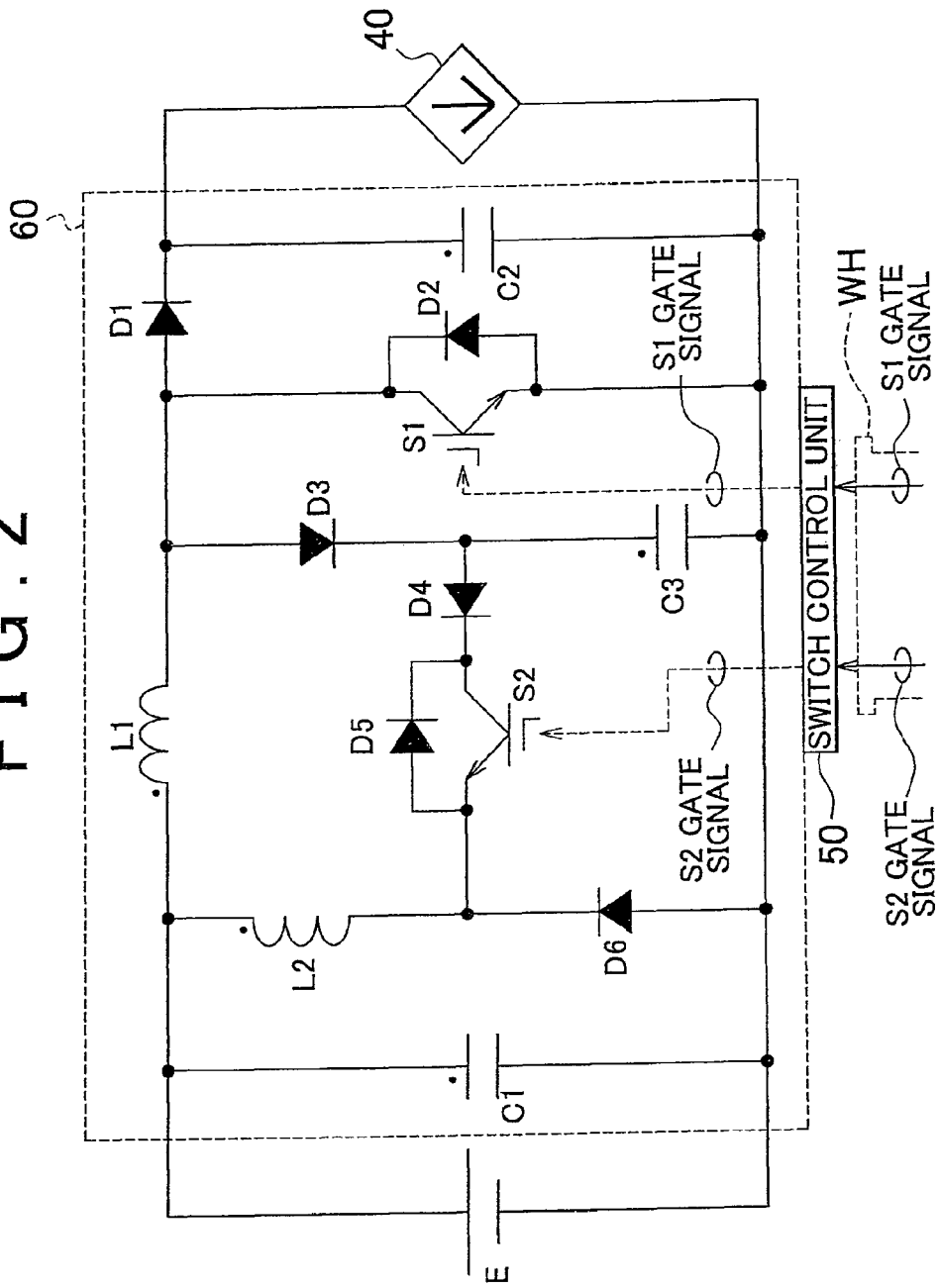
FIG. 2 is a view that illustrates the circuit configuration of a soft switching converter 60.

Next, the configuration of the soft switching converter 60 will be described. FIG. 2 is a view that illustrates the circuit configuration of the soft switching converter 60. Incidentally, the detailed operation principle of the soft switching converter is described in Japanese Patent Application Publication No. 2009-165245 (JP-A-2009-165245), so the description thereof is omitted.

The soft switching converter 60 is formed of a chopper circuit that includes a main circuit and an auxiliary circuit. The main circuit is formed of a reactor L1, a diode D1, the switching element S1, a diode D2, a filter capacitor C1 and a smoothing capacitor C2. A first end of the reactor L1 is connected to the positive electrode of a direct-current power supply E that is the fuel cell FC (FIG. 1). The anode of the diode D1 is connected to a second end of the reactor L1, and the cathode of the diode D1 is connected to the first end of the load 40. A first end of the switching element S1 is connected to the second end of the reactor L1, and a second end of the switching element S1 is connected to the negative electrode of the direct-current power supply E and a second end of the load 40. The switching element S1 turns on or off in response to the S1 gate signal transmitted from the control unit 20. The switching element S1 may be, for example, a semiconductor element, such as an insulated gate bipolar transistor, a thyristor and a diode. The diode D2 is connected in parallel with the switching element S1 so as to protect the switching element S1. The switching element S1 functions as a main switching element according to the aspect of the invention. The filter capacitor C1 is connected between the positive electrode and negative electrode of the direct-current power supply E. The smoothing capacitor C2 is connected in parallel with the load 40. The filter capacitor C1 and the smoothing capacitor C2 each are used to stabilize input and output of the soft switching converter 60.

On the other hand, the auxiliary circuit includes a reactor L2, a diode D4, the switching element S2, a snubber diode D3, a snubber capacitor C3 and a diode D5. A first end of the reactor L2 is connected to the high-potential side of the reactor L1. The diode D4 is connected between the switching element S2 and the snubber diode D3. A first end of the switching element S2 is connected to the cathode of the diode D4, and turns on or off in response to the S2 gate signal transmitted from the control unit 20. The anode of the snubber diode D3 is connected to the first end of the switching element S1, and the cathode of the snubber diode D3 is connected to the anode of the diode D4. A first end of the snubber capacitor C3 is connected to the cathode of the snubber diode D3, and a second end of the snubber capacitor C3 is connected to the switching element S1. The diode D5 is connected in parallel with the switching element S2 so as to protect the switching element S2. The switching element S2 functions as an auxiliary switching element according to the aspect of the invention. The snubber diode D3 and the snubber capacitor C3 absorb transitional counter electromotive force that occurs at the time when the switching element S1 turns off.

In the soft switching converter 60, the operation of the switching element S1 in the main circuit and the operation of the switching element S2 in the auxiliary circuit are controlled by turning on or off the input S1 and S2 gate signals. Then, when the switching element S2 is turned on, resonance current I flowing from the snubber capacitor C3 to the reactor L2 is utilized to decrease the voltage applied to the switching element S1 at the timing of switching of the switching element S1. By so doing, it is possible to suppress switching loss that occurs because of switching. In addition, the auxiliary circuit of the soft switching converter 60 in the present embodiment includes a diode D6. The cathode of the diode D6 is connected to the other electrode of the reactor L2, and the anode of the diode D6 is connected to the negative electrode of the direct-current power supply E and the second end of the load 40. The diode D6 is provided in order to protect the switching element S2 in the event of a failure of the soft switching converter 60. For example, when the switching element S2 stops at abnormal timing because of some reason, a loop circuit formed of the diode D6 and the filter capacitor C1 absorbs surge voltage that occurs between the reactor L2 and the switching element S2 because of a steep variation in resonance current I flowing through the reactor L2. By suppressing the surge voltage, it is possible to suppress a peak inverse voltage breakdown of the switching element S2.

Figure 3:
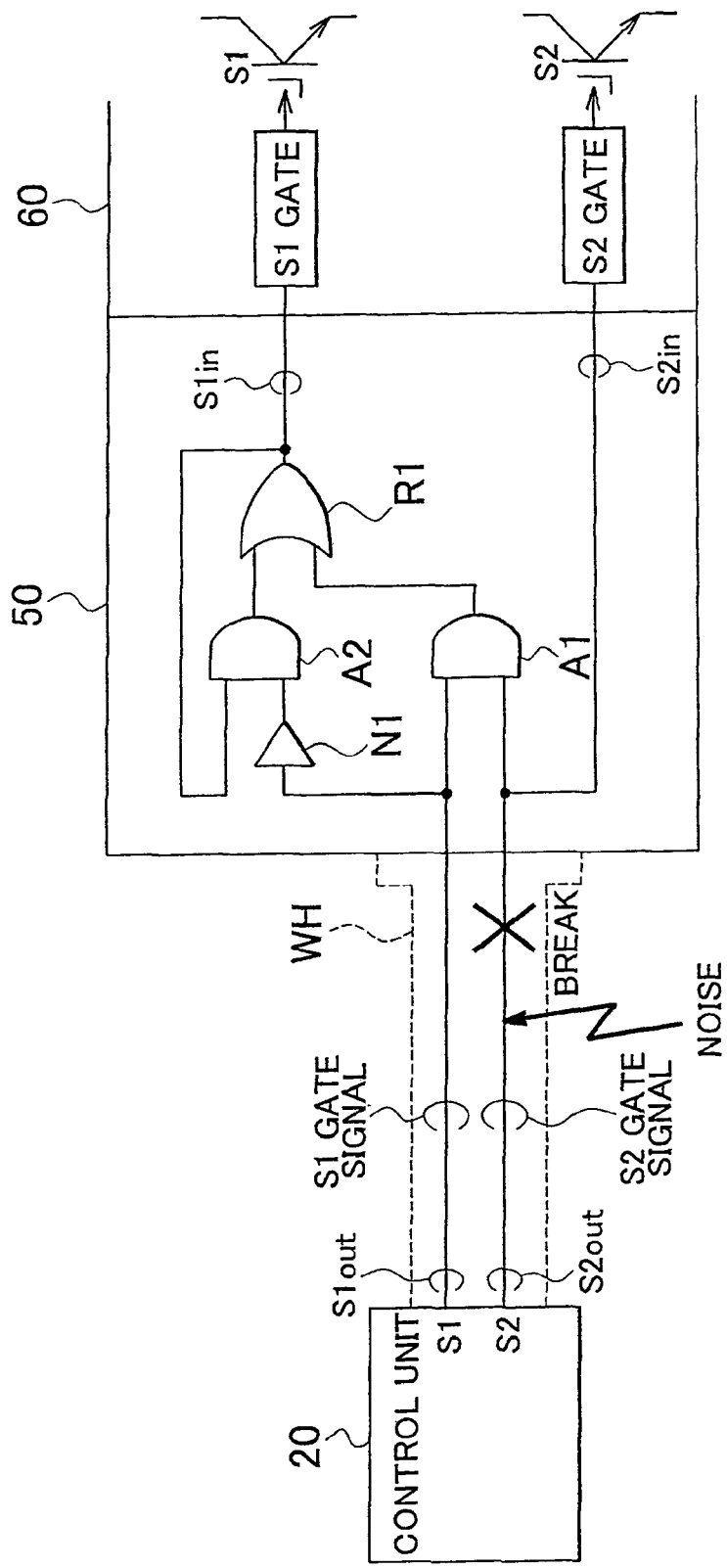
FIG. 3 is a view that illustrates the configuration of a switch control unit 50.

Next, the control unit 20 and the switch control unit 50 will be described. FIG. 3 is a view that illustrates the configuration of the switch control unit 50. The control unit 20 is connected to the switch control unit 50 by the wire harness WH. The control unit 20 outputs the S1 and S2 gate signals. The S1 and S2 gate signals are input to the switch control unit 50 via the wire harness WH.

The switch control unit 50 is electrically connected between S1 and S2 gates and the control unit 20. The S1 gate is the gate portion of the switching element S1. The S2 gate is the gate portion of the switching element S2. The switch control unit 50 is formed of a logic circuit of which the condition is set so that the S1 gate signal is not input to the switching element S1 if the S2 gate signal is not input to the S2 gate from the control unit 20 because of some reason and then the switching element S2 is not turned on. A cause that the S2 gate signal from the control unit 20 is not input to the S2 gate is, for example, a break in the wire harness WH for transmitting the S2 gate signal, an external noise, or the like, as shown in FIG. 3. As shown in FIG. 3, the switch control unit 50 is formed of a logic circuit that includes an AND circuit element A1, an AND circuit element A2, a buffer N1 and an OR circuit element R1. Note that the buffer N1 is intended for noise reduction, and the buffer N1 may be omitted. The effect of the logic circuit will be described below.

As shown in FIG. 4A and FIG. 4B, "S1in" denotes the S1 gate signal that is input to the switch control unit 50 formed of the logic circuit and then input to the S1 gate, and "S1out" denotes the S1 gate signal that is output from the control unit 20 toward the switch control unit 50. "S2out" denotes the S2 gate signal that is output from the control unit 20 toward the switch control unit 50, and "S2in" denotes the S2 gate signal that is input to the switch control unit 50 and then input to the S2 gate. FIG. 4A indicates that, when the S2 gate signal is normally output from the control unit 20 (see "S2out") and is input to the switch control unit 50 (see "S2in"), the S1 gate signal input to the logic circuit (switch control unit 50) is input to the S1 gate (see "S1in"). Note that the positional correspondence relationship among "S1in", "S2out", "S1in" and "S1out" is shown in FIG. 3.

FIG. 4B indicates the case where the S2 gate signal is not normally input to the switch control unit 50 because of a break in the wire harness WH or a noise between the control unit 20 and the switch control unit 50. As shown in FIG. 4B, when the S2 gate signal is output from the control unit 20 (see "S2out") but the S2 gate signal is not input to the logic circuit (switch control unit 50) because of a break in the wire harness WH, a noise, or the like, (see "S2in"), the logic circuit (switch control unit 50) executes control so that the input S1 gate signal is not input to the S1 gate and the switching element S1 is not turned on (see "S1in").

As described above, because the fuel cell system 10 in the present embodiment includes the switch control unit 50, the switching element S1 turns on if the S2 gate signal (turn-on signal) is normally input to the S2 gate. By so doing, a breakdown of the switching element S1 is suppressed. As is specifically described, the soft switching converter 60 controls the timing of turn-on/off of the switching element S2 to thereby carry out soft switching operation for decreasing the voltage applied to the switching element S1 at the timing when the switching element S1 is turned on. It is assumed that the power supply device 30 does not include the switch control unit 50. When the S2 gate signal is not normally input to the S2 gate because of a break in the wire harness WH or a noise between the control unit 20 and the switch control unit 50 in this case, control of the voltage applied to the switching element S1 by the switching element S2 does not function. Thus, the voltage applied to the switching element S1 does not decrease at the timing of switching of the switching element S1. As the switching element S1 turns on in this case, soft switching operation is not achieved, and the switching element S1 is subjected to switching at a high-voltage current (hard switching), so there is a possibility that a breakdown occurs in the switching element S1.

In the case of the present embodiment, the power supply device 30 includes the switch control unit 50. Therefore, when the S2 gate signal is not normally input to the S2 gate because of a break in the wire harness WH or a noise, the turn-on signal of the S1 gate signal is interrupted by the switch control unit 50 before the S1 gate signal is input to the S1 gate. Thus, the switching element S1 is able to avoid switching operation at a high voltage (hard switching operation), so it is possible to suppress a breakdown.

The S1 gate and the S2 gate function as an input unit according to the aspect of the invention, the switching element S1 and the switching element S2 respectively function as a main switching element and an auxiliary switching element according to the aspect of the invention, and the switch control unit 50 functions as a prohibiting unit according to the aspect of the invention.

B. Alternative Embodiments to Present Embodiment

Note that the aspect of the invention is not limited to the above described embodiment; it may be modified into various forms without departing from the scope of the invention. For example, the following alternative embodiments are possible.

(B1) First Alternative Embodiment

Figure 5:
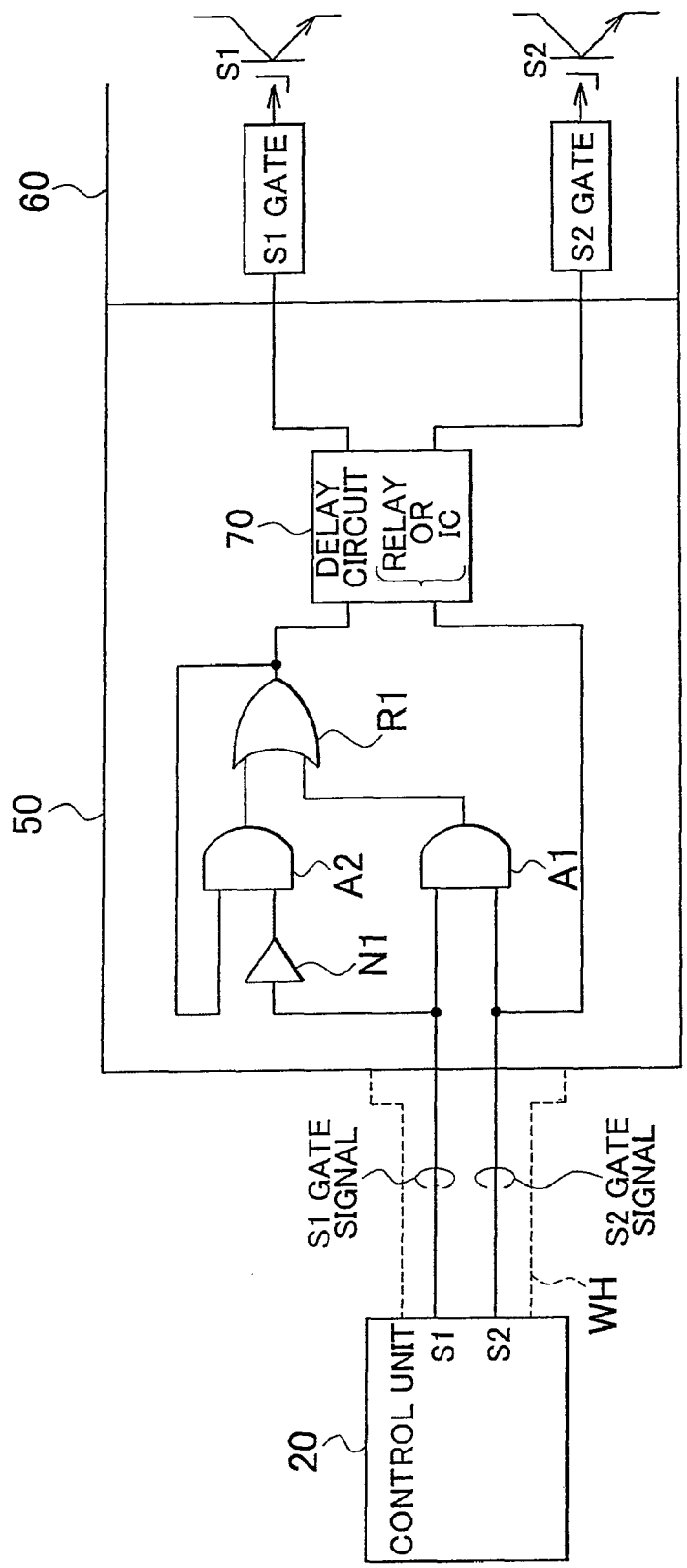
FIG. 5 is a view that illustrates the configuration of a switch control unit 50 according to a first alternative embodiment to the embodiment.
Figure 6A:
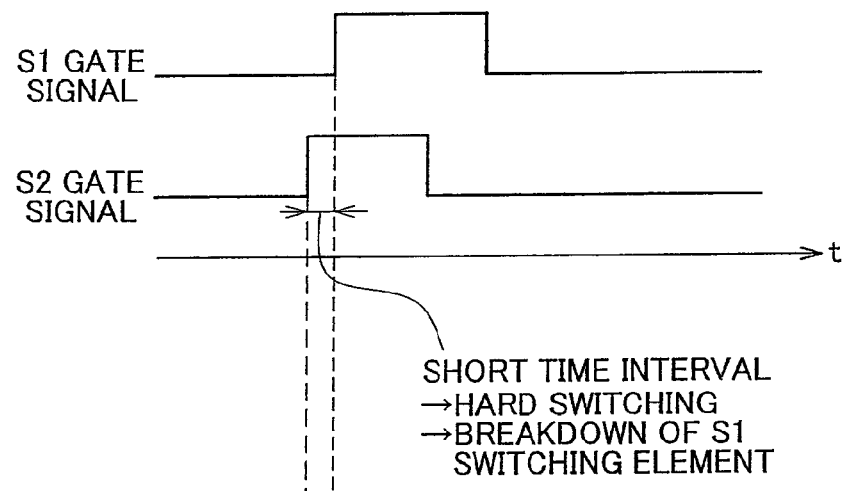
FIG. 6A and FIG. 6B are timing charts of switching of switching elements S1 and S2 according to the first alternative embodiment to the embodiment.

In the above embodiment, the switch control unit 50 inputs the turn-on signal of the switching element S1 to the S1 gate if the turn-on signal of the S2 gate signal is input; instead, in a first alternative embodiment, the switch control unit 50 may further include a delay circuit, and the S1 gate signal may be input to the S1 gate if a predetermined period of time has elapsed after the S2 gate signal is input to the S2 gate. FIG. 5 shows the configuration of the switch control unit 50 according to the first alternative embodiment. A delay circuit 70 is provided between the logic circuit and the S1 and S2 gates, which are described in the above embodiment. The delay circuit 70 may be formed of a relay or an IC. FIG. 6A shows the case where the S2 gate signal and the S1 gate signal are input to the switch control unit 50 at a short time interval because of noise, or the like. Such abnormality includes the case where the S2 gate signal is output from the control unit 20 after a delay from a predetermined timing because of noise. In this way, when the S2 gate signal and the S1 gate signal are not input at a normal time interval, soft switching operation may not function normally and the switching element S1 may be subjected to hard switching operation. This causes a breakdown of the switching element S1.

Figure 6B:
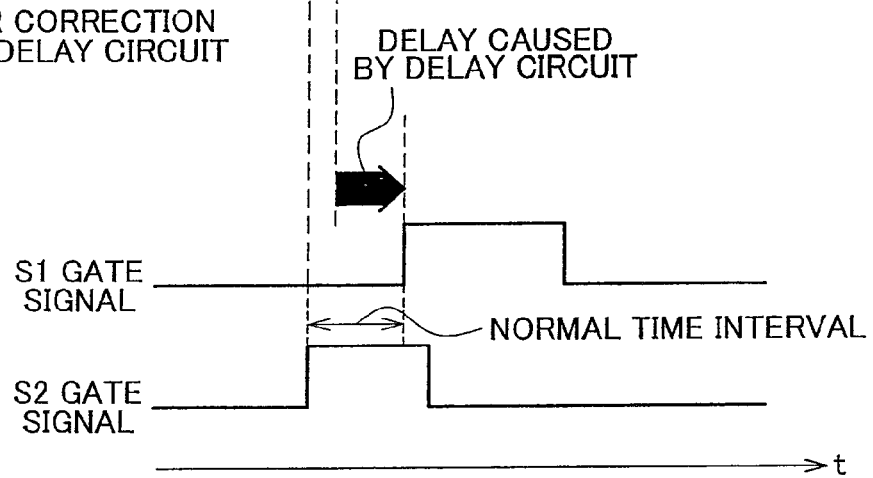

FIG. 6B is a timing chart of switching of the switching elements S1 and S2 in the case where, when the S2 gate signal and the S1 gate signal are input to the switch control unit 50 at a short time interval, the time interval is corrected to a normal time interval by the delay circuit and then the S2 gate signal and the S1 gate signal are respectively input to the S2 gate and the S1 gate. With such a delay circuit, it is possible to control switching operation of the switching elements S1 and S2 of the soft switching converter 60 in such a manner that not only the condition that "the S2 gate signal is input" but also the condition that "the S2 gate signal and the S1 gate signal are input at a predetermined time interval" is included in the condition for turning on the switching element S1.

(B2) Second Alternative Embodiment

In the above embodiment, the switch control unit 50 is formed of the logic circuit (see FIG. 3); however, the switch control circuit 50 is not limited to this configuration. Instead, the switch control unit 50 may be formed of a processor that includes a CPU. By so doing as well, similar advantageous effects to those of the above embodiment may be obtained.

(B3) Third Alternative Embodiment

Figure 7A:
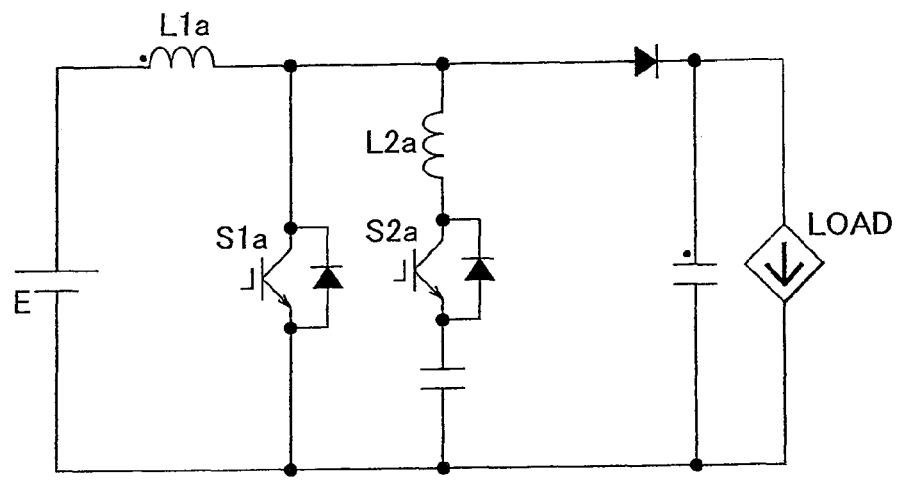
FIG. 7A and FIG. 7B are views that illustrate an example of the application of the soft switch converter.
Figure 7B:
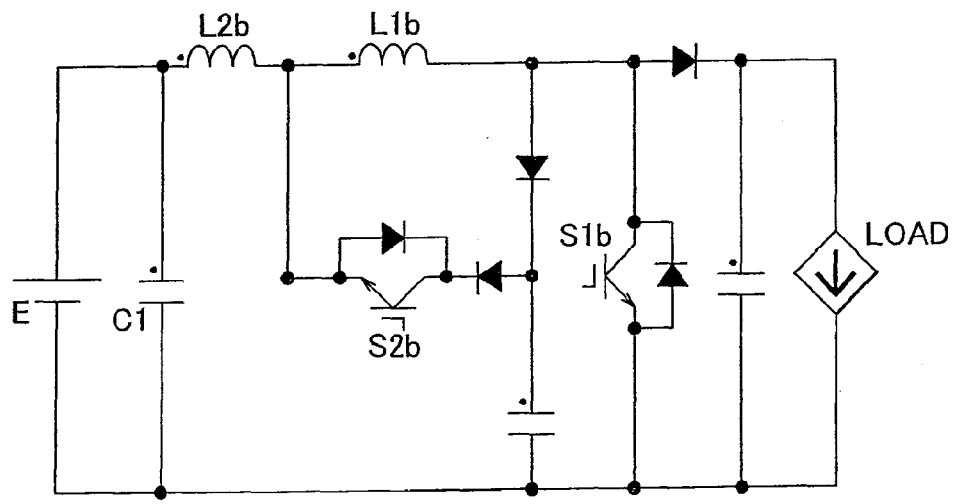

In the above embodiment, the soft switching converter has the circuit configuration shown in FIG. 2; however, the soft switching converter is not limited to this configuration. Instead, the soft switching converter may include a soft switching converter having a different circuit configuration. S1a, S2a, L1a and L2a shown in FIG. 7A and S1b, S2b, L1b and L2b shown in FIG. 7B respectively correspond to the switching element S1, the switching element S2, the reactor L1 and the reactor L2 in the first embodiment (see FIG. 2). Even when the above switching converter includes the switch control unit 50, similar advantageous effects to those of the above embodiment may be obtained.

(B4) Fourth Alternative Embodiment

In the above embodiment, the soft switching converter is described as an example of the chopper circuit that uses soft switching operation; however, the chopper circuit is not limited to this configuration. Instead, as long as the chopper circuit that uses soft switching operation includes the switch control unit 50, similar advantageous effects to those of the above embodiment may be obtained. That is, when the S2 gate signal is not normally input to the S2 gate, it is possible to suppress a breakdown of the switching element S1. The chopper circuit that uses soft switching operation may be used in the above described DC/DC converter, an AC/DC converter, a power factor correction circuit (PFC circuit), an uninterruptible power supply (UPS), a power conditioner, a frequency converter, or the like.

The invention claimed is:

1. A chopper circuit comprising:
a logic circuit that inputs a main turn-on signal for turning on a main switching element and an auxiliary turn-on signal for turning on an auxiliary the logic circuit prohibiting the main switching element from turning on unless the auxiliary turn-on signal is input to the auxiliary switching element, wherein the logic circuit includes a first AND circuit element, a second AND circuit element, and an OR circuit element; and the first AND circuit element receiving the main turn-on signal and the auxiliary turn-on signal, and the second AND circuit element receiving the main turn-on signal and the output signal from the OR circuit element, and the OR circuit element receiving the output signal from the first AND circuit element and the output signal from the second AND circuit element, and wherein the main switching element is turned on by the output signal from the OR circuit element and the auxiliary switching element is turned on by the auxiliary turn-on signal.

2. The chopper circuit according to claim 1, wherein the logic circuit includes a delay circuit, and the delay circuit prohibits the main switching element from turning on unless a predetermined period of time has elapsed after the auxiliary turn-on signal is input to the auxiliary switching element.

3. The chopper circuit according to claim 1, wherein the chopper circuit controls a timing of switching of the auxiliary switching element to carry out soft switching operation for controlling a voltage applied to the main switching element when the main switching element is turned on.

4. The chopper circuit according to claim 3, wherein the chopper circuit decreases the voltage applied to the main switching element when the main switching element is turned on.

5. A DC/DC converter comprising:
a DC input unit that is connected to a direct-current power supply;
the chopper circuit according to claim 1 that converts a voltage of direct-current power input from the DC input unit; and a DC output unit that outputs a direct-current voltage converted by the chopper circuit, wherein the chopper circuit controls a timing of switching of the auxiliary switching element to carry out soft switching operation for controlling a voltage applied to the main switching element when the main switching element is turned on.

6. A fuel cell system comprising:

a fuel cell that supplies electric power to a load; and a DC/DC converter that uses the chopper circuit according to claim 1 to control a voltage of the electric power, wherein the chopper circuit controls a timing of switching of the auxiliary switching element to carry out soft switching operation for controlling a voltage applied to the main switching element when the main switching element is turned on.

\* \* \* \* \*